(12) United States Patent
Fujimura et al.

(10) Patent No.: US 6,255,197 B1
(45) Date of Patent: Jul. 3, 2001

(54) HYDROGEN ANNEALING METHOD AND APPARATUS

(75) Inventors: Shuzo Fujimura; Toshiyuki Takamatsu, both of Chiba (JP)

(73) Assignee: Jim Mitzel, Walnut Creek, CA (US)

( * ) Notice: Subject to any disclaimer, the term of this patent is extended or adjusted under 35 U.S.C. 154(b) by 0 days.

(21) Appl. No.: 09/328,937

(22) Filed: Jun. 9, 1999

Related U.S. Application Data

(60) Provisional application No. 60/088,748, filed on Jun. 10, 1998.

(51) Int. Cl.[7] .................................................. H01L 21/322
(52) U.S. Cl. ................................................................ 438/475
(58) Field of Search ........................... 438/475, 509, 438/522, 530, 471, 474, 476

(56) References Cited

U.S. PATENT DOCUMENTS

| | | | |
|---|---|---|---|
| 6,024,145 | * | 5/2000 | Kikuchi et al. ...................... 118/723 |
| 6,063,300 | * | 5/2000 | Suzuki et al. ......................... 216/59 |

\* cited by examiner

*Primary Examiner*—David Nelms
*Assistant Examiner*—Quoc Hoang
(74) *Attorney, Agent, or Firm*—Townsend and Townsend and Crew LLP

(57) ABSTRACT

A processing method includes providing a first gas including a hydrogen atom into a first chamber, igniting a plasma within the first chamber to provide a source of hydrogen atoms, passing the plasma downstream through a cavity to a second chamber disposed separately from the first chamber, and heating an object disposed within the second chamber.

20 Claims, 2 Drawing Sheets

HYDROGEN ANNEALING METHOD AND APPARATUS

CROSS-REFERENCES TO RELATED APPLICATIONS

This application claims priority to U.S. Ser. No. 60/088,748 filed Jun. 10, 1998. This application is incorporated by reference for all purposes.

BACKGROUND OF THE INVENTION

The present invention relates to annealing of materials to improve upon material properties. More particularly, the present invention relates to a process for low-temperature, short-treatment-time annealing. Still further, the present invention relates to hydrogen annealing.

Annealing is a process that is typically used to improve the properties and characteristics of the material subject to annealing. In one type of annealing, hydrogen annealing, materials are heated at high temperature and exposed to a gas containing a hydrogen-molecule. Hydrogen annealing has been used in the manufacturing of liquid crystal displays (LCDs) to stabilize switching functions and in the manufacturing of solar cells to improve the electrical properties of solar cells. Hydrogen annealing has also been used in silicon semiconductor device manufacturing to stabilize the electrical properties of the device.

In a semiconductor manufacturing context, it is well known that exposing silicon ultra large sale integration (ULSI) devices to hydrogen gas at 400 to 450° C. at the end of a wafer-processing sequence stabilizes the electrical properties of the devices. Hydrogen annealing at higher temperatures has also been studied. For example, hydrogen annealing when performed at 800 to 900° C. improves the qualities of deposited and thermally grown oxides. Further, it has been reported in the following reference that hydrogen annealing at 1200° C. improves the qualities of silicon wafers by removing defects near the substrate surface to the depth equivalent to the device geometry: S. Samata, M. Numano, T. Amai, Y. Matsushita, H. Kobayashi, Y. Yamamoto, T. Kawaguchi, S. Nadahara and K. Yamabe, Proc. Symp. "Degradation of Elec. Devices due to Device Operation as well as Crystalline and Process-induced Defects," ECS, Pennington, 1994, 101). The reference terms wafers subject to high temperature annealing "Hi-wafers" and ASSERTS that such wafers will be useful for ULSI device manufacturing.

The percentage of deuterium in the hydrogen annealing process is thought to have an effect upon semiconductor devices subject to such anneal. In the natural environment, the volume ratio of deuterium to hydrogen is typically about 0.015%. However, with typical hydrogen gas cylinders, the volume ratio of deuterium to hydrogen may vary widely. For example, "Rika-Nenpyo (Science Data book in Japanese)", edited by National Observatory, published by Maruzen, vol. 71, 1998) reports that typical hydrogen gas cylinders typically contain 0.0032 to 0.0184% per volume of deuterium gas. This report also suggests that by treating silicon metal-oxide-semiconductor (MOS) transistors with hydrogen gas containing a higher ratio of deuterium gas than above increases the reliability of the transistor. In particular, the report suggests that a transistor annealed in a gas having a percentage of 10 to 100 of deuterium gas, at 400 to 450° C. demonstrates a ten fold increase in lifetime.

Currently, batches of wafers are annealed at the same time and not individually, for efficiency reasons. A typical hydrogen annealing process includes placing a number of semiconductor wafers into a cylindrical quartz tube, placing the tube in a furnace, heating the wafers according to a given temperature profile, maintaining the temperature at 400 to 450° C. for a period of time, and cooling the wafers down according to another given temperature profile. The time may vary from dozens of minutes to several hours, depending upon the specific recipe. Because a significant portion of the anneal time is used for heating up the wafers to a particular temperature and cooling the wafers down, annealing is a very time consuming process. As a result, single-wafer by single-wafer processing that is widely used in etching processes and chemical vapor deposition (CVD) processes, has not been suitable for the conventional hydrogen annealing.

One drawback with conventional hydrogen annealing processes is the high cost of the hydrogen gas used. Even when a diluted hydrogen gas is used, because the treatment or anneal time is long, a large volume of gas is still used. When deuterium is used for annealing, which is much more expensive than hydrogen, the cost of the gas used is even greater. For example, the cost of deuterium gas for annealing a hundred 8-inch wafers for an hour is estimated to be $20,000 to $30,000.

Another drawback with conventional hydrogen annealing processes is that equipment costs are high. For example, with conventional hydrogen annealing, the flow rate of these gases (hydrogen or deuterium) needed for typical multiple-wafer processes must be large. Because of this, the exhaust system used for such gases must have a large capacity. The installation of such large exhaust systems raises the capital and operational costs of the fabrication facility.

Another drawback of the conventional hydrogen annealing is that the high process temperature may cause other defects in the device. As disclosed above, typical hydrogen annealing process uses temperatures ranging from 400 to 450° C. These temperatures are typically below the melting point of aluminum that is used for interconnection in ULSI devices, however these temperatures are sufficient to cause deformations of aluminum grain boundaries on the wafer. As a result of these deformations, hillocks may appear in the aluminum grains. When such hillocks appear in grain boundaries used for ULSI interconnects, these hillocks may cause stress migration of aluminum, may break the interconnection due to thermal expansion coefficients mismatch between aluminum and underlying materials, and the like.

Yet another drawback to conventional hydrogen annealing is that handling of the multiple wafers can introduce extra defects. As disclosed above, single-wafer by single wafer processing that is widely used in etching processes, chemical vapor deposition (CVD) processes, and the like. These processes typically utilize multiple chamber machines that can isolate the single wafers from the atmosphere between processes, and cluster-type tools. Because of the increased isolation of the wafers during such processes, it has been demonstrated that higher wafer reliability is achieved, lower native oxide growth appears, and the like.

One modification proposed to address some of these drawbacks has been to perform hydrogen annealing at a lower temperature, for example 200° C. A drawback to this proposal is that it appears that the annealing is ineffective. In particular, it does not appear that enough hydrogen is diffused into a device to cause improvement in the electrical properties of silicon dioxide and the interface between silicon and silicon dioxide.

Another modification proposed to address some of these drawbacks has been to perform hydrogen annealing at a higher temperature, for example 1200° C. A drawback to this "Hi-wafer" process is that special higher cost processing equipment is required. For example, instead of using quartz tubes that are conventionally used within the annealing furnace, special high temperature tubes must be used. As an example, high temperature materials include silicon carbide (SiC), which is quite expensive compared to quartz.

Thus what is required in the industry are more efficient, economical, and effective ways to anneal semiconductor wafers using a hydrogen gas or a deuterium gas.

SUMMARY OF THE INVENTION

The present invention relates to annealing methods and apparatus. In particular, the present invention relates to hydrogen annealing.

The present invention discloses methods and apparatus for low-damage hydrogen annealing that utilizes downstream plasma to reduce the effect of harmful active species in a plasma. The present invention also discloses that the gas injected into the chamber must include hydrogen atoms. Further, the present invention discloses annealing with a lower-cost source of deuterium.

According to an embodiment of the present invention a processing method includes providing a first gas including a hydrogen atom into a first chamber, igniting a plasma within the first chamber to provide a source of hydrogen atoms, passing the plasma downstream through a cavity to a second chamber disposed separately from the first chamber, and heating an object disposed within the second chamber.

According to yet another embodiment of the present invention a computer program product for a computer coupled to an annealing unit, the computer including a processor, includes code configured to direct the processor to enable a flow of a first gas including a hydrogen atom into a first chamber of the annealing unit, code configured to direct the processor to ignite a plasma within the first chamber to form a plasma including hydrogen atoms, code configured to direct the processor to create a flow of plasma from the first chamber downstream through a cavity within the annealing unit to a second chamber within the annealing unit, the second chamber disposed separately from the first chamber, and code configured to direct the processor to heat an object disposed within the second chamber. The codes reside on a tangible media.

According to yet another embodiment, a processing apparatus includes a plasma generation chamber configured to receive a gas mixture, a plasma ignition source configured to ignite the gas mixture to form a plasma, and a cavity coupled to the plasma generation chamber and configured to allow the plasma to exit the plasma generation chamber. A treatment chamber coupled to the cavity, the treatment chamber configured to receive the plasma from the cavity; and a heating source disposed within the treatment chamber and configured to heating a substrate disposed within the treatment chamber are also provided.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DESCRIPTION OF THE SPECIFIC EMBODIMENTS

The effect of hydrogen annealing on semiconductor devices has typically been measured by the change of the electrical properties of such devices. However, the atomic-scale change in the structure of the devices due to the hydrogen has not been clearly understood. It is believed, that hydrogen (or deuterium) annealing at 400–450° C. promotes the diffused hydrogen and/or deuterium to bond with dangling bonds at SiO2/Si interfaces. As a result, the hydrogen and/or deuterium forms Si—H or Si-D bonds. Eliminating these dangling bonds is believed to reduce the electrical instability of the devices.

It has been discovered that atomic hydrogen may be preferred for annealing rather than molecular hydrogen. For example, when molecular hydrogen is introduced into an anneal chamber, there must first be sufficient energy to cause the hydrogen to dissociate to individual atoms, before the hydrogen atoms recombine with the silicon. The sufficient energy is typically provided by increasing the temperature of the annealing furnace. As disclosed above, however, increasing the annealing temperature often has its own drawbacks. By providing a source of atomic hydrogen for annealing purposes therefore, the annealing temperature and annealing time may be reduced.

E. Cartier and J. H. Stathis, "Atomic Hydrogen-Induced Degradation of the Si/SiO$_2$ Structure", Microelectronics Engineering, 28, 3 (1995) suggests atomic hydrogen may not be suitable for annealing purposes. The article discloses experimental results discussing the effect of SiO2/Si interfaces of a MOS capacitor with Al gate due to atomic hydrogen. The particular source of atomic hydrogen was provided by a hydrogen plasma that was located "upstream" from the device. Alternatively, the device was located "downstream" from the hydrogen plasma chamber. The article concluded that there was little, if any, observation that the atomic hydrogen bonded with dangling silicon bonds.

Figure 1:
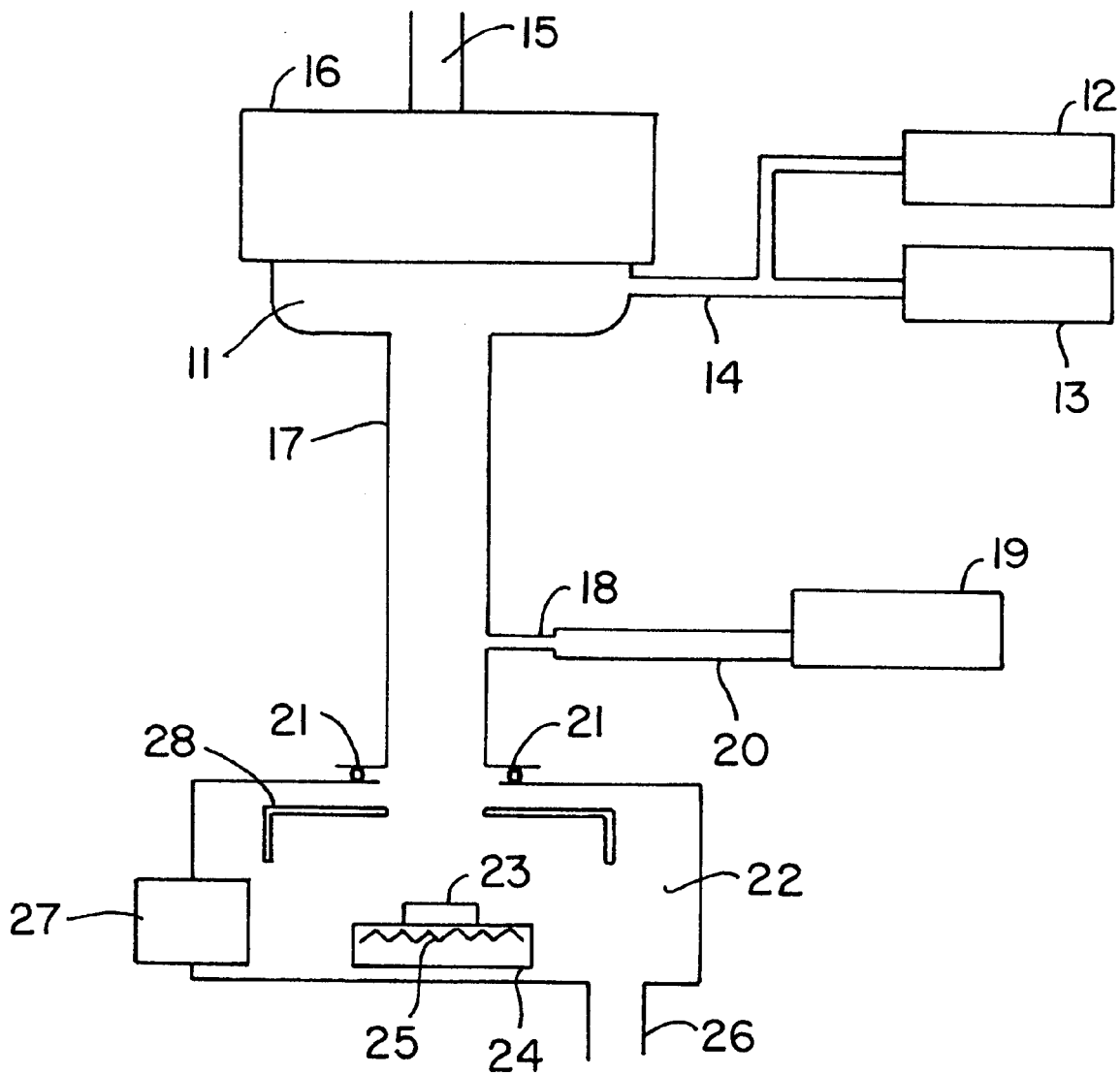
FIG. 1 is a simplified overview diagram of an embodiment of the present invention.

FIG. 1 is a simplified overview diagram 10 of an embodiment of the present invention.

The embodiment illustrated in FIG. 1 includes a plasma discharge chamber 11 for containing a plasma. Chamber 11 may be manufactured from materials having sufficient physical ability to contain a plasma including quartz, alumina, and the like. The interior to chamber 11 typically is coated with a layer of silicon nitride when chamber 11 is manufactured from quartz and/or alumina. In other embodiments, different coatings, and the like may be used.

In this embodiment, a first gas is coupled from gas supply 12 to chamber 11, and a second gas is coupled from gas supply 13 to chamber 11. Gas supply 12 and gas supply 13 typically include mass flow controllers, valves, filters, and the like, although not explicitly shown. Gas supply 12 and gas supply 13 may be introduced to chamber 11 by an operator, computer control, or the like. In the present embodiment, gas supply 12 provides a gas at a controlled pressure including a hydrogen atom or deuterium atoms such as hydrogen gas, deuterium gas, respectively, and the like. Further, gas supply 13 provides a gas at a controlled pressure such as a halogen, nitrogen, inert gas, oxygen, or the like. In alternative embodiments, other types of gases can be used.

A controlled flow of gas from gas supply 12 and a controlled flow of gas from gas supply 13 are mixed before introduction into chamber 11, in this embodiment. In particular, the gases become mixed before being fed through gas fitting 14. As shown, gas fitting 14 is coupled to chamber 11 and provides the mixtures of the above mentioned gases to chamber 11. The amount of gas from Gas supply 12 and gas supply 13 are controlled by an operator, computer control, or the like.

In the present embodiment, a microwave source is used to ignite and maintain a plasma within chamber 11. In this embodiment, a microwave generator 15, typically a magnetron tube, is used to provide a source of microwave energy. In the present embodiment, amount of energy output by microwave generator 15 is controlled by an operator, by a computer, or the like. In alternative embodiments of the present invention, other types of plasma ignition and maintenance are contemplated, for example, the present invention can use any rf source or the like.

Waveguides 16, typically made of metal, guide microwave energy from microwave generator 15 to chamber 11, as illustrated. In this example, the gas mixture from gas fitting 14 is then subjected to the microwave energy introduced within chamber 11 by waveguides 16.

Microwave cavity 17 is coupled to chamber 11, in the present embodiment, to allow plasma formed within chamber 11 to reach a treatment chamber 22. Microwave cavity 17 is typically embodied as a metal-walled cavity that has sufficient dimensions to allow a relatively uniform flow of the plasma to treatment chamber 22. Treatment chamber 22 is considered "downstream" of chamber 11, alternatively, chamber 11 is considered "upstream" from treatment chamber.

In this embodiment, a third gas is coupled from gas supply 19 to microwave cavity 17. Gas supply 19 typically also includes a mass flow controller, valves, filters, and the like, although not explicitly shown. Gas supply 19 may be introduced to microwave cavity 17 and controlled by an operator, computer control, or the like.

In the present embodiment, gas supply 19 provides a gas at a controlled pressure including a water vapor, although in alternative embodiments, other types of gases can be used. As shown, gas fitting 19 is coupled to microwave cavity 17 via nozzle 18. Nozzle 18 provides the third gas to cavity 17 at a downstream position relative to chamber 11. In alternative embodiments of the present invention gas supply 19 is not used.

O-ring 21 is provided between chamber 11 and microwave cavity 17 in this embodiment. O-ring 21 is typically used to seal the physical interface between chamber 11 and microwave cavity 17 such that plasma generated in chamber 11 does not escape before entering treatment chamber 22. In one embodiment, O-ring 21 may also be used to electrically isolate microwave cavity 17 from treatment chamber 22. Typically, O-ring 21 is manufactured from a plasma resistant material, which is typically used in the art, or the like.

In this example, treatment chamber 11 may include a loading and unloading port 27, an inner wall 28, an exhaust port 26, a stage 24, and a heat source 25.

Loading and unloading port 27 may be embodied as a conventional vacuum lock chamber having at least two sets of access doors. In such an embodiment, an object 23, such as a semiconductor wafer is loaded through a first door into a vacuum lock chamber, the first door is closed, a vacuum is formed within the vacuum lock chamber, and then the second door, leading to treatment chamber 22, is then opened. Unlike currently performed multiple wafer annealing described above, wafers may be kept within a controlled environment during an annealing process provided by the present embodiments.

In the present embodiment, object 23, subject to plasma treatment is disposed on stage 24 within treatment chamber 22. Stage 24 may include a heating source 25 that is used to heat object 23 to desired temperatures. Heating source 25 may begin heat object 23 before or after the plasma begins to flow in different embodiments. In an alternative embodiment, heating source 25 may be separate from stage 24, or the like. The amount of heat provided by heating source 25, as well as ramp-up and ramp-down profiles can be controlled by an operator, computer control, or the like.

Heating source 25 is typically a high temperature unit manufactured from silicon carbide ("SiC"), or the like. In the present embodiment, heating source 25 provides heating of object 23 to temperatures of 1200 degrees C. and higher. In alternative embodiments of the present invention, other types of heating sources may be used, for example, radiant heating, rapid thermal annealing, conductive heating, and others.

In the above embodiment, a plasma of gases from first gas supply 12, second gas supply 13, and third gas supply 19 are provided to treat object 23. For example, one possible treatment is to perform a hydrogen annealing. In this embodiment, a vacuum exhaust port 26 may be coupled to a vacuum pump, to provide a vacuum to treatment chamber 22 and to exhaust the treatment gases from treatment chamber 22. The vacuum pump, not shown, may be a rotary vacuum pump, or the like. The vacuum pump is typically controlled by an operator, computer control, or the like.

Chamber 11 may also include an inner wall 28 to protect the walls of treatment chamber 22 or for any other reason.

In the present embodiment, chamber 11 is partially separated from treatment chamber 22, although the plasma generated upstream in chamber 11 is passed downstream to treatment chamber 22, as disclosed above. Such separation reduces defects that may appear on object 23 if object 23 were disposed directly within chamber 11. In particular, as is known, generation of plasmas often causes production of radicals that may harm a substrate during an anneal process. By providing a downstream treatment chamber for the generated plasma, the number of harmful radicals is reduced, by the time the plasma reaches the substrate. Accordingly, the damage to the substrate is reduced by using embodiments of the present invention.

EXAMPLES

To prove the principle and operation of the present invention, examples have been provided. These examples are merely illustrations, which should not limit the scope of the claims herein. One of ordinary skill in the art would recognize many other variations, modifications, and alternatives. The present examples can be implemented using a tool such as the one described herein. The examples are as follows:

First Example

In this example, the embodiment illustrated in FIG. 1 was used to perform hydrogen annealing. The plasma source gases used included $H_2$:95 sccm and $Cl_2$:5 sccm, and the gases were activated with a 500 watt 2.45 GHz microwave source. In this example, the treatment object was a 6 inch CZ Si wafer covered by a native silicon oxide film. The processing pressure, time and stage temperature were 2 Torr, 2 hours and 900° C., respectively.

The characteristics of the treated wafer illustrated near surface equivalent to conventional hydrogen annealing of 1200 degrees C. In particular, defects due to oxygen precipitation were studied in the silicon bulk by cross sectional infrared topography observation and the denuded zone of crystal defects was studied. Although some surface roughness was observed, the lower temperature annealing described appeared to be equivalent to the higher temperature anneal.

Second Example

In this example, the embodiment illustrated in FIG. 1 was used to perform deuterium annealing. The plasma source gases used included deuterium molecule gas containing 99% deuterium: 95 sccm and $Cl_2$:5 sccm, and the gases were activated with a 500 watt 2.45 GHz microwave source. In this example, the treatment object was a 6 inch Si wafer covered by a 10 nm thick silicon dioxide film grown in dry oxygen ambient. The processing temperature was 200° C. for 10 minutes.

The characteristics of treated wafer suggests that deuterium annealing can be performed at relatively low temperatures and with short annealing times. In this example, a depth profile of deuterium was carried out using secondary ion mass spectroscopy after treatment. The deuterium concentration reached a maximum value $3\times10^9 cm^{-3}$ at the depth of approximately 10 nm from the surface, namely, at $SiO_2/Si$ interface. The results suggest that disappearance of dangling bonds in $SiO_2$ and at $SiO_2/Si$ can be performed at lower temperatures and lower gas costs.

Third Example

In this example, the embodiment illustrated in FIG. 1 was used to perform deuterium annealing. The plasma source gases used included deuterium molecule gas containing 99% deuterium: 95 sccm and $Cl_2$:5 sccm, and the gases were activated with a 500 watt 2.45 GHz microwave source. In this example, the treatment object was a 6 inch Si wafer covered by an amorphous silicon film grown using a conventional chemical vapor deposition at 600° C. The processing temperature was 200° C. for 10 minutes.

The characteristics of treated wafer suggests that Si—H or Si-D bonds can be added after growth of an amorphous silicon film with a low temperature and high efficiency. In this example, an absorption peak at 1530 $cm^{-1}$ attributed to Si-D stretching vibration process was observed using a transmission Fourier transform infrared absorption spectroscopy. The result suggests that lower temperature and higher efficiency annealing can be performed increasing the efficiency of amorphous silicon solar cells, for example.

Figure 2:
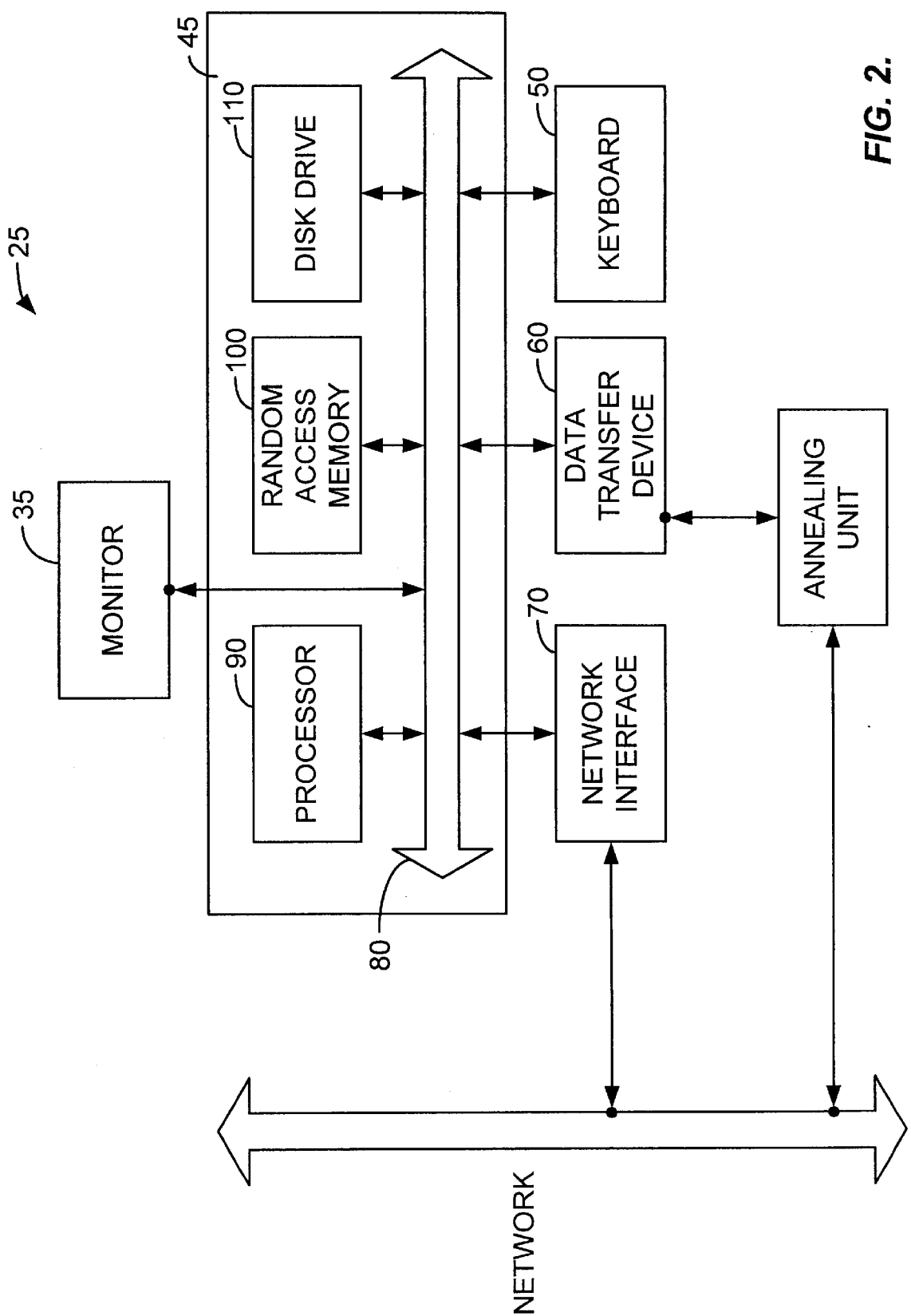
FIG. 2 is a simplified overview diagram of an embodiment of the present invention.

FIG. 2 is a block diagram of an embodiment according to the present invention. Specifically, FIG. 2 illustrates a typical control apparatus that provides control of various features of the embodiment described above. Control apparatus 25 typically includes a monitor 35, a computer 45, a keyboard 50, a data acquisition device 60, and a network interface 70. Computer 45 typically includes familiar computer components such as a processor 90, and memory storage devices, such as a random access memory (RAM) 100, a disk drive 110, and a system bus 80 interconnecting the above components.

Graphical input devices may also be provided. Graphical input devices are typically embodied as a computer mouse, a trackball, a track pad, wireless remote, and the like. Graphical input devices typically allow the users to graphically select objects, icons, text and the like output on monitor 30 in combination with a cursor. For example, users graphically select buttons on monitor 30 for controlling different aspects of different portions of the present embodiment.

Embodiments of network interface 70 may include an Ethernet card, a modem (telephone, satellite, cable, ISDN), (asynchronous) digital subscriber line (DSL) units, and the like. Data transfer device 60 may be provided to receive feedback from various portions of the above embodiment, for example, current temperature of treatment chamber 22, flow rates of the gases, pressure within treatment chamber 22, and the like. Further, data transfer device 60 may also be used to send instructions, and other data to various portions of the above embodiment, for example, gas shut-off valves, and the like.

In one embodiment, the embodiment described above is coupled to a wide area network, such as the Internet, or a local area network. Such embodiments may provide feedback data through such a network. In such a case, control apparatus 25 may receive feedback data from the above embodiment, via network interface 70, or the like.

RAM 100 and disk drive 110 are examples of tangible media for storage of data, files, computer programs, embodiments of the herein described methods of operation, and the like. Other types of tangible media include floppy disks, removable hard disks, optical storage media such as CD-ROMS and bar codes, semiconductor memories such as flash memories, read-only-memories (ROMS), and battery-backed volatile memories, and the like. In embodiments of the present invention such as a microcontroller, mass storage, such as disk drive 110, and the like may be dispensed with.

In one embodiment, control apparatus 25 includes a PC compatible computer having '586 or '686 class based microprocessors, such Pentium™-class (Pentium™, PentiumII™, or PentiumIII™) microprocessor from Intel Corporation. Further, embodiments of control apparatus 25 may include a Windows™ (Windows95™, Windows98™, WindowsNT™) operating system from Microsoft Corporation.

In embodiments where feedback data are available on an intranet or the Internet, control apparatus 25 may include software browsers that allow a controller to monitor data and to send data. Software browsers are typically embodied as Netscape Navigator™ 4.5, Microsoft's Internet Explorer™ 4.0, or the like. Embodiments of the above described methods for annealing and the like, may be implemented with programs written as browser applets. For example, Java language applets.

In the present embodiments, software browsers include virtual machines that enable interpreting of applets downloaded from a computer network. For example, one virtual machine is Java virtual machine, version 1.1, or later; in another example, virtual machine is an ActiveX virtual machine; and the like. In alternative embodiments, just-in-time compilers may also be used for enabling executing of such downloaded applets.

FIG. 2 is representative of but one type of system for embodying the present invention. It will be readily apparent to one of ordinary skill in the art that many other hardware and software configurations are suitable for use with the present invention. For example, other types of processors are contemplated, such as K6-2 microprocessors from Advanced Micro Devices Corporation, PowerPC G3 microprocessors from Apple Computer Corporation, and the like. Further, other types of operating systems are contemplated, such as LINUX, MAC OS 8.5 from Apple Computer Corporation, and the like.

Other types of controllers, including microcontrollers, and the like may be used. Such embodiments may include a variety of processors, microcontrollers, ASICs, and the like.

As described above, hydrogen annealing and deuterium annealing are now possible at lower temperatures and for shorter times. This is enabled by treating (annealing) surfaces at a location downstream from a gas plasma source. The gas can be a mixture of molecules containing hydrogen (or deuterium) atoms and halogen, nitrogen, inert gas, oxygen, or the like. By providing another gas supply downstream, the amount of plasma carried to the surface may be increased. It is expected that a 100 times increase in efficiency is possible by use of embodiments of the present invention. The embodiments of the present invention also reduce the amount of hydrogen or deuterium consumed, reduce the requirements for a large exhaust system, and the like. Embodiments of this invention are thus useful for many industries including semiconductor, solar panel fields, and the like.

In the foregoing specification, the invention has been described with reference to specific exemplary embodiments and examples thereof. Many changes or modifications are readily envisioned. For example, the actual physical configuration of the apparatus may be different than that shown if FIG. 1, and the physical parameters and times used may be different than the discloses examples. In another example, different types of plasma ignition and maintenance sources are available than microwave, for example, such as other forms of rf sources, mixed sources, plasma immersion sources, and the like.

The physical aspects of the present embodiment, including lock and load, gas supplies, heating processes, and the like may be manually controlled, controlled by a microcontroller, by a networked computer, or the like. For example, a computer may control the heating profile of the object, the flow rates of the respective gases, the microwave power, and the like.

The composition of such gases may vary and the flow rates can vary. For example, the gases supplied for the plasma may include a mixture of hydrogen and deuterium, as well as a halogen, or the like. Further, the gas supplied downstream may include water vapor, or other gas, in combination with a halogen, or the like. As disclosed above, processing temperatures can vary according to specific application of the disclosed invention. For example, processing may occur at 900 degrees C., 200 degrees C., 120 degrees C., or the like.

Embodiments of the present invention may be combined with other processing equipment such as etching equipment, CVD equipment, and the like. Further, embodiments may share a controlled processing environment with such other processing equipment. For example, embodiments may be combined with a cluster tool, or the like.

The block diagrams of the architecture are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A processing method for annealing an object, the method comprising:
   providing a first gas including a hydrogen atom into a first chamber;
   igniting the first gas within the first chamber to provide a plasma containing hydrogen atoms;
   passing the plasma downstream through a cavity to a second chamber disposed separately from the first chamber; and
   heating an object disposed within the second chamber while exposing the object to the plasma thereby to anneal the object.

2. The processing method of claim 1 wherein the first gas comprises hydrogen.

3. The processing method of claim 2 wherein the first gas also comprises deuterium.

4. The processing method of claim 1 further comprising:
   providing a second gas into the first chamber, the another gas selected from the class: halogen, nitrogen, inert gas, oxygen.

5. The processing method of claim 1 further comprising:
   providing a third gas into the cavity.

6. The processing method of claim 5 wherein the third gas comprises water vapor.

7. The processing method of claim 1 wherein heating the object comprises heating the object to less than approximately 120 degrees C.

8. The processing method of claim 1 wherein heating the object comprises heating the object to less than approximately 200 degrees C.

9. The processing method of claim 8 wherein the object comprises a silicon substrate having an oxide layer.

10. An object processed according to the method of claim 1 wherein the object is selected from a silicon wafer, a flat panel, or a substrate.

11. A processing method for annealing an object, the method comprising:
    providing a first gas including a deuterium atom into a first chamber;
    igniting the first gas within the first chamber to provide a plasma containing deuterium atoms;
    passing the plasma downstream through a cavity to a second chamber disposed separately from the first chamber; and
    heating an object disposed within the second chamber while exposing the object to the plasma thereby to anneal the object.

12. The processing method of claim 11 wherein the first gas comprises molecular deuterium.

13. The processing method of claim 12 wherein the first gas further comprises hydrogen.

14. The processing method of claim 11 further comprising:
    providing a second gas into the first chamber, the second gas selected from the class consisting of halogen, nitrogen, inert gas and oxygen.

15. The processing method of claim 11 further comprising:
    providing a third gas into the cavity.

16. The processing method of claim 15 wherein the third gas comprises water vapor.

17. The processing method of claim 11 wherein heating the object comprises heating the object to less than approximately 120° C.

18. The processing method of claim 11 wherein heating the object comprises heating the object to less than approximately 200° C.

19. The processing method of claim 18 wherein the object comprises a silicon substrate having an oxide layer.

20. An object processed according to the method of claim 11 wherein the object is selected from the group consisting of a silicon wafer, a flat panel, and a substrate.

* * * * *